United States Patent
Despont et al.

(10) Patent No.: US 7,491,425 B2
(45) Date of Patent: Feb. 17, 2009

(54) SCANNING PROBE-BASED LITHOGRAPHY METHOD

(75) Inventors: Michel Despont, Adliswil (CH); Urs T. Duerig, Rueschlikon (CH); Jane E. Frommer, San Jose, CA (US); Bernd W. Gotsmann, Horgen (CH); James L. Hedrick, Pleasanton, CA (US); Craig Jon Hawker, Los Gatos, CA (US); Robert D. Miller, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 914 days.

(21) Appl. No.: 10/978,028

(22) Filed: Oct. 29, 2004

(65) Prior Publication Data

US 2006/0091322 A1    May 4, 2006

(51) Int. Cl.
*B05D 3/06* (2006.01)
(52) U.S. Cl. .................. 427/277; 427/557; 427/355; 427/271; 977/849; 977/850; 977/851; 977/855; 977/857

(58) Field of Classification Search .............. None
See application file for complete search history.

(56) References Cited

U.S. PATENT DOCUMENTS

| | | | |
|---|---|---|---|
| 2002/0127491 A1* | 9/2002 | Weiss et al. | 430/296 |
| 2003/0218960 A1* | 11/2003 | Albrecht et al. | 369/126 |
| 2005/0047307 A1* | 3/2005 | Frommer et al. | 369/101 |

* cited by examiner

*Primary Examiner*—William Phillip Fletcher, III
(74) *Attorney, Agent, or Firm*—Cantor Colburn LLP; Peter Tennet

(57) ABSTRACT

A resist medium in which features are lithographically produced by scanning a surface of the medium with an AFM probe positioned in contact therewith. The resist medium comprises a substrate; and a polymer resist layer within which features are produced by mechanical action of the probe. The polymer contains thermally reversible crosslinkages. Also disclosed is a method that generally includes scanning a surface of the polymer resist layer with an AFM probe positioned in contact with the resist layer, wherein heating the probe and a squashing-type mechanical action of the probe produces features in the layer by thermally reversing the crosslinkages.

1 Claim, 7 Drawing Sheets

SCANNING PROBE-BASED LITHOGRAPHY METHOD

FIELD OF THE INVENTION

The present invention relates generally to a scanning probe-based lithography (hereinafter SPL), and in particular to an SPL method in which patterning of a resist medium is produced by Atomic Force Microscope (hereinafter AFM) probe-surface contact. In particular it relates to the "writing" of a pattern of lines and similar features in a resist. More particularly, the invention relates to a polymer resist for use in a scanning probe-based lithography method.

BACKGROUND OF THE INVENTION

The AFM is a well-known device in which the topography of a sample is modified or sensed by a probe or probe mounted on the end of a microfabricated cantilever. As the sample is scanned, the interaction of atomic forces between the probe and the sample surface causes pivotal deflection of the cantilever. The topography of the sample may be determined by detecting this deflection of the probe. By controlling the deflection of the cantilever and the physical properties of the probe the surface topography may be modified to produce a pattern on the sample.

Lithography is the process for producing a pattern of two dimensional shapes made by drawing primitives such as lines and pixels within a layer of material, such as, for example, a resist coated on a semiconductor device. Conventional photolithography is running into severe problems as the feature size is reduced below 65 nm. These problems arise from fundamental issues such as sources for the low wavelength of light, photoacid migration, photoresist collapse, lens system quality for low wavelength light and masks cost. To overcome these issues an alternative approach to the generation of sub-50 nm features is required.

One approach to addressing these issues is to use a scanning probe-based lithography (SPL) device. In this strategy a probe is raster scanned across a resist surface and brought to locally interact with the resist material. By this interaction resist material is removed or changed in a way that it can be developed.

SPL is described in detail in Chemical Reviews, 1997, Volume 97 pages 1195 to 1230, "Nanometer-scale Surface Modification Using the Scanning Probe microscope: Progress since 1991", Nyffenegger et al. and the references cited therein. In particular, the article describes use of organic materials as lithographically active layers (see pages 1219 and 1220) which have been used in mechanical modicon experiments to generate line patterns in the organic resist material.

In the mechanical modification experiments the drawing primitives are physically realized as indentations in the polymer layer created by heating the cantilever probe and with the application of force pressing this probe into the polymer. The probe is heated by passing a current through a resistive heater integrated in the cantilever, directly behind the probe. Some of the heat generated in the resistor is conducted through the probe and into the polymer layer, locally heating a small volume of the polymer. If sufficient heat is transferred to raise the temperature of the polymer above a certain temperature (which is dependent on the chosen polymer), the polymer softens and the probe sinks in, creating an indentation or line. Examples of organic resist materials used were poly(methyl methacrylate) (PMMA) and poly(glycidyl methacrylate) PGMA.

There are a number of problems with the known implementations of SPL. These problems include difficulty with crossing lines if material is not properly removed but only squashed to the side by the interacting probe, contamination of the probe if material is not removed, and if a layer is structured by indenting or scratching with the probe, the probe tends to wear.

The efficiency of forming indentations is therefore critically dependent on the nature of the polymeric thin film used as the resist. Desirable attributes of the polymeric thin film are 'softness' and deformability during the writing phase, stability, toughness and resistance to wear during mechanical and chemical processing. A hard polymer with a high melting point will be difficult to soften sufficiently for the probe to sink in and form the pit during the writing process. Linear polymers such as PMMA have been found to have suitable writing temperatures and the force required on the probe to form the indentation is acceptably low for the required probe performance and power consumption; however, rim formation around the indentations and the erasing of indentations when writing indentations in close proximity is a problem. Such problems would be overcome by using a harder crosslinked polymer but this would lead to unacceptable probe wear rate during writing.

An example of scanning thermal lithography using polymers which undergo selective crosslinking is disclosed at http://www.eecs.umich.edu/~basualpages/SThL. html.

The present invention seeks to overcome these problems by using a class of polymers which under controlled conditions have the characteristics of linear polymers and are thus suitable for the writing phase but have the characteristics of crosslinked polymers during subsequent processing steps.

SUMMARY OF THE INVENTION

The invention provides a resist medium in which features are lithographically produced by scanning a surface of the medium with an AFM probe positioned in contact therewith, said medium comprising a substrate; and a polymer resist layer within which features are produced by mechanical action of the probe, characterized in that the polymer contains thermally reversible crosslinkages.

Wear of the AFM probe is minimized using the invention because mechanical contact of the probe with the resist during the lithographic process is with polymer having crosslinkages broken or opened by the heating effect of the probe; the softer polymer being easier to mechanically pattern than the fully crosslinked polymer. The polymers are preferably non-adhesive in the uncrosslinked state to avoid contamination of the probe.

Reference to a heated probe is used herein to refer to a combination of heat and force being used. The present invention also provides a lithography system comprising an AFM head having a probe connected to a resistive path locally exerting heat at the probe when an electrical current is applied; and a resist medium comprising a polymer containing thermally reversible crosslinkages as hereinbefore described.

The lithography system preferably includes a plurality of AFM heads arranged in the form of at least one array enabling a parallel approach to producing the pattern on the resist medium and thereby increasing the patterning speed. More preferably the resist medium is arranged to be moved in a predetermined direction and the AFM head array is fixed thereby enabling the resist medium to be scanned by the head array. Alternatively the AFM head array may be moveable and may be scanned across a fixed resist medium.

In yet a further embodiment of the present invention there is provided a lithographic process for producing features in a resist medium comprising arranging a heat emitting probe connected to a resistive path, in contact with a resist medium as hereinbefore described; driving a current through the resistive path thereby heating the probe to a predetermined feature forming temperature thereby causing local softening of the organic polymer resist layer allowing the AFM probe to penetrate the resist layer to form an indentation in the resist.

In a preferred embodiment the heat and force applied to the probe are varied to control the penetration of the probe into the resist medium enabling indent height to be varied; this approach enables 3-dimensional patterning producing multi-level structures within the resist layer. This is particularly useful if the topography of the surface beneath the resist varies because of the presence of features on the substrate.

The present invention may advantageously used in prototyping patterned resists. Unlike conventional production of patterned resists, the present invention enables a suitable software controlled AFM head or array of heads to "write" the pattern on the resist. In effect the conventional mask used in optical lithography may be produced in situ by the process of the present invention.

The present invention further provides a patterned resist medium which may be scanned with an AFM probe positioned in contact therewith to read the pattern in order to check whether the desired patterning has been formed in the lithographic process.

As described above, the polymer resist of the present invention contains thermally reversible crosslinkages. Crosslinking between polymer chains can be effected in a number of ways. Crosslinks may be achieved by having pendant groups on the polymer chains which may be linked directly or via linking agents. The crosslinks of the present invention must be capable of being severed upon heating and preferably may reform spontaneously on cooling.

The polymer resist medium is most suitably an organic polymer. The thermally reversible crosslinkages are preferably based on covalent bonds. A particularly preferred polymer resist is an organic polymer comprising polymer chains which are connected one to another with Diels-Alder adducts. As used herein reaction is a cycloaddition reaction, also referred to as a conjugate reaction, in which an alkene, also referred to as a dienophile, adds to a 1,3-diene, that is, a conjugated diene, to form a six-membered ring A Diels-Alder adduct of formula (Structure I in the Appendix): wherein X1 and X2 may be the same or different and are electron attracting substituents, R1 is hydrogen, R2 is hydrogen, Y1 and Y2 may be the same or different and are hydrogen, alkyl or substituted alkyl, is formed by the reaction of a diene of formula (Structure II in the Appendix) wherein X1 and X2 are as hereinbefore defined, and a dienophile of formula (Structure III in the Appendix) wherein R1, R2, Y1 and Y2 are as hereinbefore defined. The diene and dienophile, and the adduct produced therefrom are suitably attached directly or indirectly to the polymer backbone by at least one of X1 and X2, and R1, R2, Y1 and Y2 respectively.

The Diels-Alder reaction is reversible and the rate of reaction between the diene and the dienophile to form the adduct, and the rate of the reverse reaction may be controlled by appropriate selection of the diene and dienophile and the substituents X1 and X2, and R1, R2, Y1 and Y2 attached thereto.

Crosslinked resins comprising polymer chains connected to one another by Diels-Alder adducts are known from, for example, U.S. Pat. No. 5,641,856 in the name of Shell Oil Company and U.S. Pat. No. 6,271,335 in the name of Sandia Corporation.

One advantage of using thermally reversible crosslinked materials, such as for example those based on Diels-Alder chemistry is that because the crosslinks are thermally reversible, as a result the material undergoes a dramatic change from a tough crosslinked solid to a soft, viscous melt of lower molecular weight fragments as the temperature is raised above the critical temperature at which the reverse Diels-Alder reaction occurs.

The "writing" mechanism of these polymers appears to be different from that observed for the polymers of the prior art. The polymers of the prior art are patterned using a 'squashing-type' mechanism where material is compacted but no significant molecular diffusion occurs; large rims around the indentations are formed. The much lower viscosity of the thermally reversed, non-crosslinked form of the polymers of the present invention leads to significant diffusion of the molecules during writing and as a result the rim around the indentation does not form to the same extent; the overall dimension of the indentation is significantly decreased. An overall decrease in indentation dimension leads to increased density of patterning because the indentations can be packed closer together.

One particular class of Diels-Alder crosslinked polymers suitable for use in the present invention is the group of polymers having Diels-Alder adducts formed from a dienophile and a substituted furan.

Suitable furans include those of formula (Structure IV in the Appendix) wherein R3 represents hydrogen or an alkyl group and R4 represents a functional group linking to a polymer chain. Preferably R3 represents hydrogen or a methyl group. Preferred furans within formula (Structure IV in the Appendix) are the polymeric materials of formula (Structure V in the Appendix) wherein n and m represent the number of oligomeric units in the polymer chain.

Preferred dienophiles for use in the present invention are derivatives of maleimide. Suitable maleimides include those of formula (Structure VI in the Appendix) wherein R5 represents a functional group linking to a polymer chain. Preferred maleimides within formula (Structure VI in the Appendix) are the polymeric materials of formula (Structure VII in the Appendix) wherein n and m represent the number of oligomeric units in the polymer chain.

The Diels-Alder adduct formed by the reaction of the furan of formula (Structure V in the Appendix) and the maleimide of formula (Structure VII in the Appendix) may be represented by formula (Structure VIII in the Appendix) wherein n and m are as defined above. The Diels-Alder adduct of formula (Structure VIII in the Appendix) is a tough highly crosslinked polymer which cleaves to form the furan (Structure V in the Appendix) and maleimide (Structure VI in the Appendix) at temperatures greater than 140° C. The mixture of furan (Structure V in the Appendix) and maleimide (Structure VI in the Appendix) is a soft material with viscous fluid properties. At temperatures below about 130° C. the Diels-Alder adducts reform to produce the tough highly crosslinked polymer. For use in the lithography media of the present invention the polymer of formula (Structure VII in the Appendix) would require a write-temperature in excess of 140° C.

In an alternative embodiment the polymer is a silicone derivative. The furan of formula (Structure IX in the Appendix) wherein R6 is alkyl or cycloalkyl, may be reacted with a maleimide of formula (Structure X in the Appendix) wherein R7 represents —$CH_2$—, —$CH_2CH_2$—, or 1,4-phenylene to produce a crosslinked network polymer. The degree of crosslinking may be controlled by adding furan to the reaction mixture as a chain length inhibitor. Preferably R6 is cyclohexyl. Preferably R7 is 1,4-phenylene.

The crosslinked network may be represented by formula (Structure X1 in the Appendix) wherein R6 and R7 are as hereinbefore defined.

The properties of the crosslinked polymeric material are chosen such that the material can be spin-cast onto the substrate to give a uniform thickness of film at the desired thickness. One suitable method of spin coating requires the polymeric material to be spin coated onto the substrate in an uncrosslinked state this may be done by using a temperature above which the cross links are broken.

In an alternative preferred method, the spin coating may be done at a lower temperature using a diene and/or dienophile precursor which is converted to the diene and/or dienophile after the spin coating. Suitable precursors of the dienophile include protected dienophiles. A multifunctional diene as described above and a protected multifunctional dienophile are mixed and spin coated onto the substrate to give a thin polymer film of the desired thickness. It is preferable to use a protected, multifunctional dienophile since this allows a stable mixture of the two components to be prepared which in turn allows thin films of reproducible thickness to be obtained. Heating of the thin film of polymer then leads to deprotection of the dienophile which undergoes reaction with the multifunctional diene via Diels Alder chemistry to give a highly crosslinked thin film. Such a highly crosslinked film is tough and resistant to wear at temperatures below the reverse Diels Alder reaction temperature; however, above this critical temperature the reverse Diels Alder reaction occurs to break the crosslinks and the original precursor molecules are obtained. Since these original precursor molecules are lower molecular weight, non-crosslinked materials, the thin films becomes very soft and writing is much easier than for a similar thin film composed on non-reversible crosslinks. The multifunctional diene and dienophile may be small organic molecules, they may also be functionalized linear chains, branched polymers, block copolymers, dendrimers, hyper-branched macromolecules or mixtures thereof.

The transition temperature between the crosslinked state and the uncrosslinked state, which may be written as Tr, may also be referred to as the crosslinkage cleavage temperature. The transition temperature between the crosslinked and the uncrosslinked material described above may be readily determined for any crosslinked polymer by experimentation. For example, the transition temperature for the polymer of formula (Structure VII in the Appendix) is between about 130° C. and 140° C., the transition temperature for the polymer of formula (Structure X1 in the Appendix) wherein R6 is cycloalkyl. and R7 is 1,4-phenylene is about 120° C.

The class of crosslinked polymers described above which are connected one to another with Diels-Alder adducts is one example of suitable polymeric materials for use in the present invention. Any class of crosslinked polymer in which the crosslinks may be cleaved thermally are suitable for use in the present invention subject to the proviso that the cleavage temperature is within the working temperature range of the STM probe. The crosslinked polymers described above contain covalent thermally reversible crosslinks. In an alternative embodiment the crosslinkages are suitably non-covalent bonds.

In a preferred alternative embodiment the crosslinkages are hydrogen bonds (H-bonding). One advantage for the use of non-covalent crosslinkages such as hydrogen bonds is the potential to tailor the strength of the crosslinking by changing the number and nature of the non-covalent interactions. If H-bonding is used, crosslinks may involve individual H-bonds or quadruple H-bonds which have a significantly higher dissociation temperature than the materials formed from individual H-bonds thereby modifying the operating parameters of the lithography medium One suitable example of a quadruple H-bonding system is shown in Reaction Scheme 1.

The crosslinked polymer of formula (Structure XII in the Appendix), wherein P is the polymer backbone and R is hydrogen or an alkyl group is suitably formed by dissolving a linear polymer of formula (Structure XIII in the Appendix) containing the H-bonding crosslinking units in a polar solvent which is chosen for its H-bonding character and ability to disrupt the H-bonding between the crosslinking units. This solution is then spin-cast onto an appropriate substrate such as those described above to give a thin medium of the desired thickness. The solvent is evaporated and as the solvent is removed the H-bonding units along the polymeric backbone start to form crosslinks leading to formation of a crosslinked polymer (Structure XII in the Appendix).

The highly crosslinked polymer (Structure XII in the Appendix) is tough and resistant to wear at temperatures below the temperature at which the H-bonds break.

For quadruple H-bonding units the temperature at which the crosslinks are cleaved is about 80 to 100° C. Above this critical temperature the H-bonding units break removing the crosslinks and the original precursor molecules are obtained.

The precursor molecules are lower molecular weight, non-crosslinked materials, and as for the covalent thermally reversible crosslinked materials described above, the thin film becomes very soft and patterning is much easier than for a similar thin film composed on non-reversible crosslinks. The H-bonding units may be small organic molecules, functionalized linear chains, branched polymers, block copolymers, dendrimers, hyperbranched macromolecules or mixtures thereof.

The thickness of the polymer resist layer is suitably in the range 2 to 1000 nm, more suitably 2 to 200 nm, most suitably 2 to 50 nm, with a thickness of about 5 nm being preferred.

The substrate upon which the polymer resist layer is deposited is most suitably silicon. The silicon substrate may be patterned or modified depending upon the stage in the fabrication process the present lithographic process is being used. Other suitable substrates for use in the present invention may be electrically conducting or non-conducting, and include metallic surfaces and conventional insulators such as, for example, silicon dioxide.

BRIEF DESCRIPTION OF THE DRAWINGS

Preferred embodiments of the invention will now be described, by way of example, with reference to the accompanying drawings in which.

DESCRIPTION OF THE INVENTION

Figure 1A:
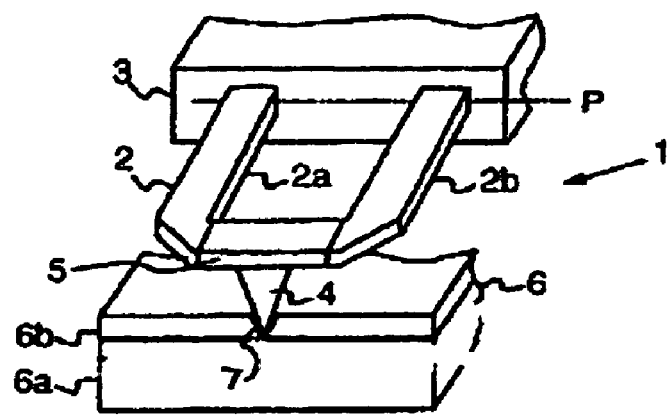
FIGS. 1a to 1c illustrate the construction and operation of a patterning/read component for a lithographic device including the resist medium of the present invention.
Figure 1B:
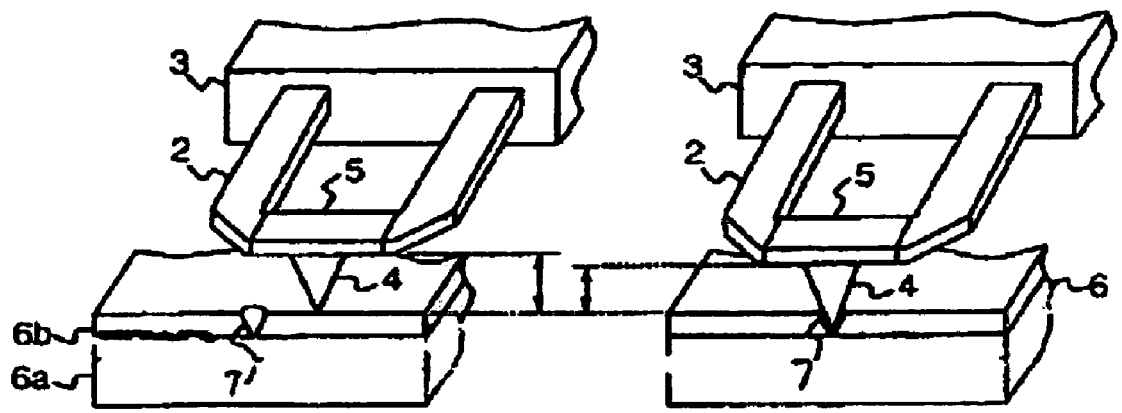
Figure 1C:
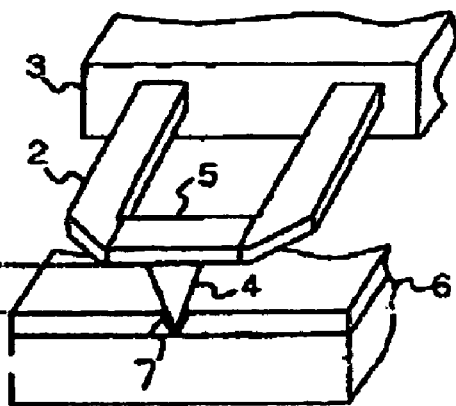

A patterning/read component 1 of an AFM-based lithographic device is shown schematically in FIGS. 1a to 1c of the accompanying drawings. The component 1 comprises a generally U-shaped cantilever 2 which is connected to a support structure 3 (only partially shown in the figures). Flexing of the legs 2a, 2b of the cantilever 2 provides for substantially pivotal movement of the cantilever about a pivot axis P. The probe 4 is provided on a heater 5 which forms a platform at the end of the cantilever 2. The highly-doped silicon cantilever legs 2a, 2b define a current path connecting the heater platform 5 between a pair of electrical supply lines (not shown) on the support structure 3.

In operation, the probe 4 is biased against the surface of the resist medium of the present invention indicated schematically at 6 and shown here in cross-section.

The resist comprises a substrate 6a and a resist layer 6b.

In the patterning mode, the heater platform 5 can be heated to a patterning temperature TW by application of a patterning-mode potential across the supply lines. The consequent heating of the probe 4 results in heat transfer to the resist layer 6a causing local softening of the polymer. This allows the probe 4 to penetrate the surface layer to form a pit, or indentation, 7 as shown in FIG. 1a. The resist medium 6 can be moved relative to patterning/read component 1 allowing the probe to write patterning over an area of the surface corresponding to the field of movement.

Another important aspect of the present invention is the fact that the success of the writing can be checked in situ by means of topographic imaging of the indentations created in the writing process. The process of reading back the topography from the lithography medium involves sensing the height of the probe with respect to a predetermined reference level. This may be accomplished by means of thermo-mechanical sensing which entails mechanically connecting a heat emitting resistive path to the probe, driving a current through the resistive path to a predetermined temperature and determining the thermal conductance between the resistive path and the storage medium. The thermal conductance between the resistive path and the resist medium is a function of the distance between the heat emitting path and the surface of the resist medium. Alternatively, any other method for sensing the height of the probe known in the art of local probe microscopy can be employed for imaging purposes. Prominent examples are optical deflection sensing, optical interferometric sensing, piezo resistive sensing, piezo electric sensing.

In the illustrated example of thermo-mechanical sensing, in the "read" mode, the heater platform 5 is used as a thermal sensor by exploiting its temperature-dependent resistance. A read-mode potential is applied across the supply lines to heat the heater to a reading temperature TR which is less than the writing temperature TW and not high enough to cause softening of the polymer. As the resist surface is scanned by the probe 4, the pivotal position of the cantilever 2 at each indentation position differs according to the presence or absence of an indentation 7. In the absence of an indentation, as shown in FIG. 1b, the distance between the heater platform 5 and storage medium 6 is greater than the corresponding distance when an indentation is present, and the probe enters the indentation, as shown in FIG. 1c. Heat transport across the air gap between the heater 5 and resist medium 6 is thus more efficient when an indentation is present, and since more heat is then lost to the resist medium, the temperature of the heater 5, and hence its resistance, will be reduced. Thus, as the resist surface is scanned, the position of indentations is detected by monitoring changes in the temperature of the heater 5, in practice by monitoring changes in the voltage across a series resistor in one of the supply lines.

Figure 2:
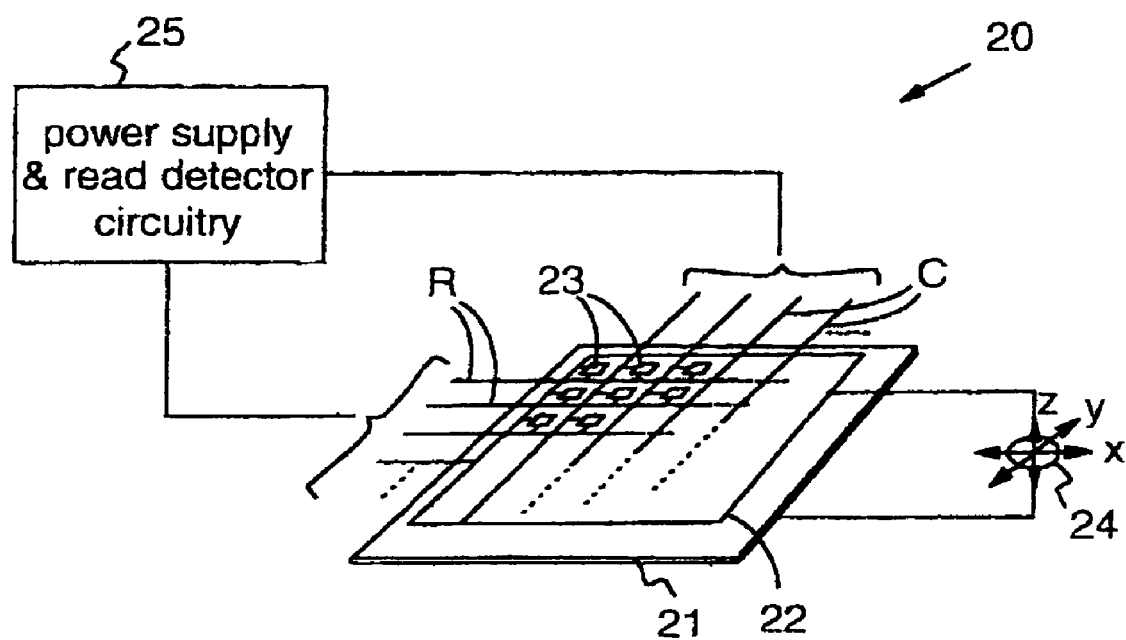
FIG. 2 is a schematic representation of a lithographic device in which the resist medium of the invention can be employed.

FIG. 2 depicts a lithographic device 20 including a resist medium 21 and a lithographic apparatus as described above in the form of an array 22 of patterning/read components 23. It is to be appreciated, however, that these components may include additional circuitry, such as amplifiers etc., where required. Each patterning/read component 23 is connected to two supply lines, a row supply line R and a column supply line C, as indicated schematically in the FIG. 2. All components 23 in the same row of the array share the same row supply line R. Similarly, all components in the same column of the array share the same column supply line C. Drive means, indicated schematically at 24, enables the relative movement of the array and resist medium, whereby the array can be accurately located in its operating position against the resist medium.

The row and column lines R, C of array 22 are connected to power supply and read detection circuitry indicated generally at 25. Circuitry 25 operates to supply power to the components of the array 22, the individual components 23 being addressed by their row and column lines in known manner via row and column multiplexers (not shown) of circuitry 25. Each component 23 can be addressed in both a patterning mode and a read mode, the power supply circuitry supplying a "write" signal via the supply lines in the patterning mode, and a read mode signal via the supply lines in the read mode. The resist medium 21 comprises a substrate having a thin layer of the polymer of the present invention spin coated thereon. The pattern is written in and read from the resist medium as described in relation to FIG. 1 above.

FIGS. 3a to 3f are a schematic partial cross sectional representation of a lithographic process using a resist medium of the present invention. FIG. 3 depicts an intermediate stage in the production of a semiconductor device. The partially constructed semiconductor device comprises a substrate 100 on which a number of features 101, 102 have been produced in an area for the construction of devices 120. In addition the substrate carries a mask alignment area 103 including an alignment mark 104 from a previously formed layer. A resist layer 105 of the present invention has been deposited on the upper surface of the semiconductor device using known resist deposition techniques. The cantilever 106 and the probe of the AFM probe are shown above the surface of the resist.

Figure 3A:
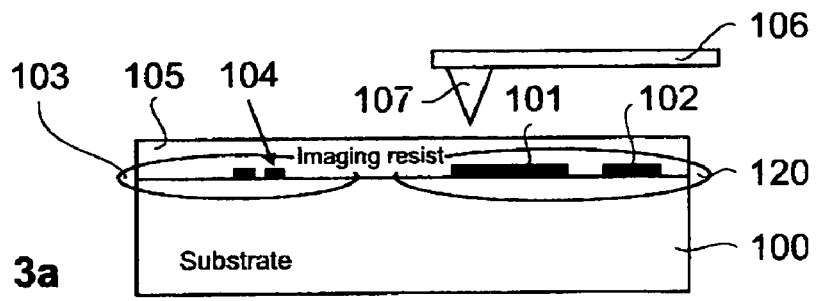
FIGS. 3a to 3f are a schematic partial cross sectional representation of a lithographic process using a resist medium of the present invention.
Figure 3B:
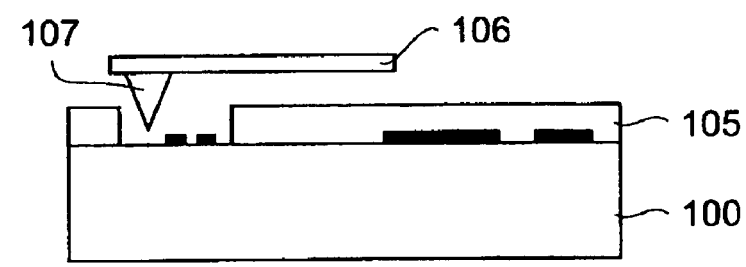

In FIG. 3b the resist layer 105 in the region of the mask alignment area 103 has been removed to reveal the alignment mark 104. The removal of the resist layer 105 is preferably carried out using the lithographic process of the present invention.

Figure 3C:
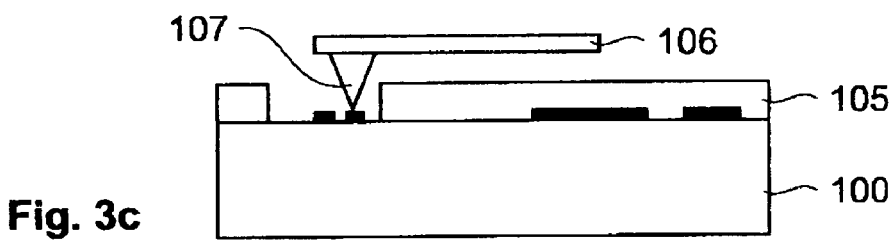

As illustrated in FIG. 3c, prior to the lithographic process being used to produce further indentations in the resist, it is necessary for the probe to be accurately aligned with the partially constructed semiconductor device. Alignment is effected by reading the topography at the mask alignment area 103 and moving the probe 107 or substrate 100 to align the probe 107 with the alignment mark 104.

Figure 3D:
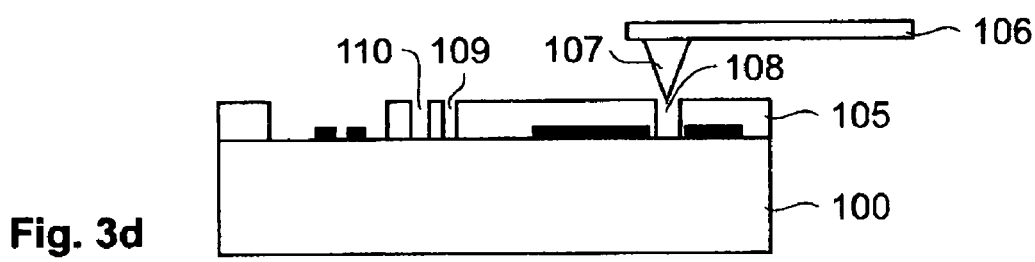
Figure 3E:
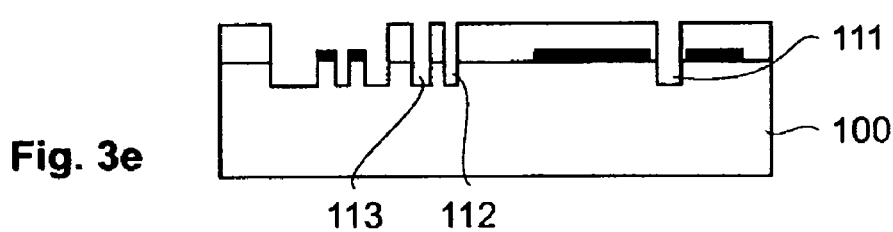

Under the control of suitable probe controlling software, the probe 107 is moved across the resist layer 105 and heat applied at predetermined locations 108, 109, 110 to cause the probe to displace (expose/evaporate) the resist layer to produce indentations exposing the upper surface of the substrate 100. FIG. 3d shows in partial cross section the desired layout of indentations and exposed substrate. The result of a substrate removal process is shown in FIG. 3e where trenches 111, 112, and 113 are shown in the substrate 100 having been formed by a removal process, such as for example etching, in the regions 108, 109, and 109 produced by the lithographic process of the present invention.

Figure 3F:
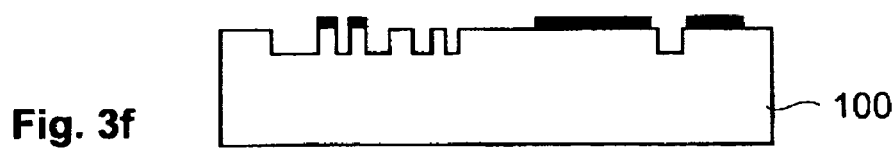

FIG. 3f shows the substrate 100 after removal of the remaining resist layer. The substrate is available for further processing and the steps shown in FIGS. 3a to 3f may be repeated to produce a further lithographically produced pattern.

Figure 4:
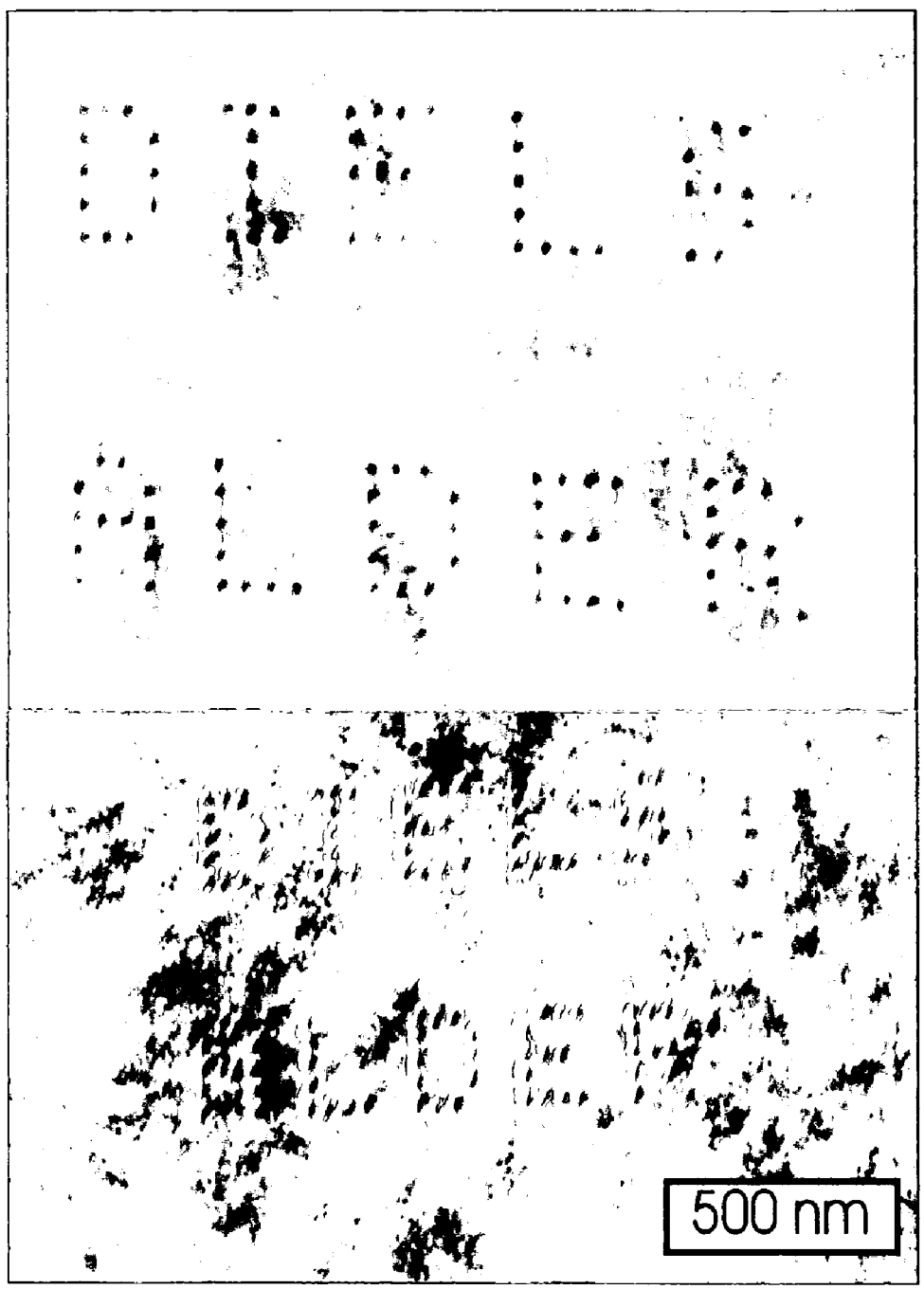
FIG. 4 is a Scanning Force Microscopy image of a resist medium of the present invention showing a pattern written in the resist using the lithographic process of the present invention.

FIG. 4 is an Atomic Force Microscope image of a resist medium of the present invention. The indentations appear as dark areas on the otherwise gray background which is the polymer resist surface. The polymer and polymer film used to obtain the image were prepared as described in the following examples.

Figure 5:
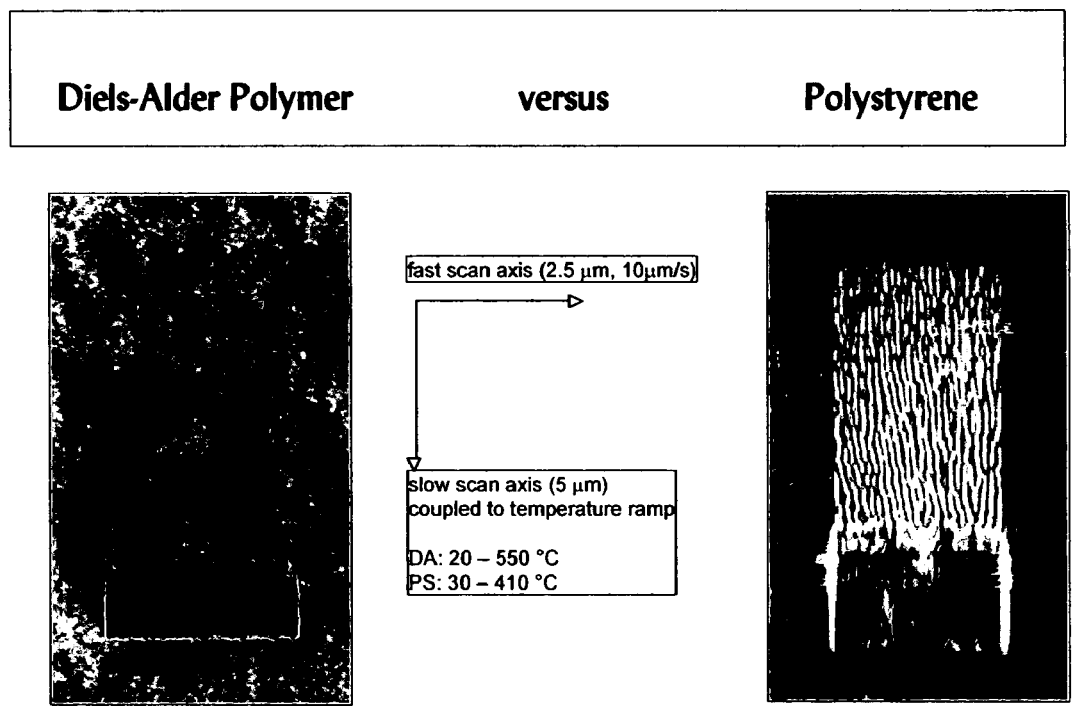
FIG. 5 is a Scanning Force Microscopy image of a resist medium of the present invention and a conventional resist medium showing exposure of an area with varying exposure temperature.

FIG. 5 is a Scanning Force Microscopy image of a resist medium of the present invention and a conventional resist medium showing exposure of an area with varying exposure temperature. The exposed area in FIG. 5 consists of 2.5 micrometer long lines closely spaced over 5 micrometers. Each line has been exposed for the same time but with varying exposure temperature. From this the cross-section in FIG. 6 was extracted allowing estimation of the exposure depth as a function of temperature for the given tip and scan speed. It becomes apparent that a threshold temperature is needed to remove material (i.e. during exposure), below that threshold the resist remains unchanged and no resist medium wear can be observed. For comparison uncrosslinked materials such as, for example, PMMA will show indentations in the resist medium.

Figure 6:
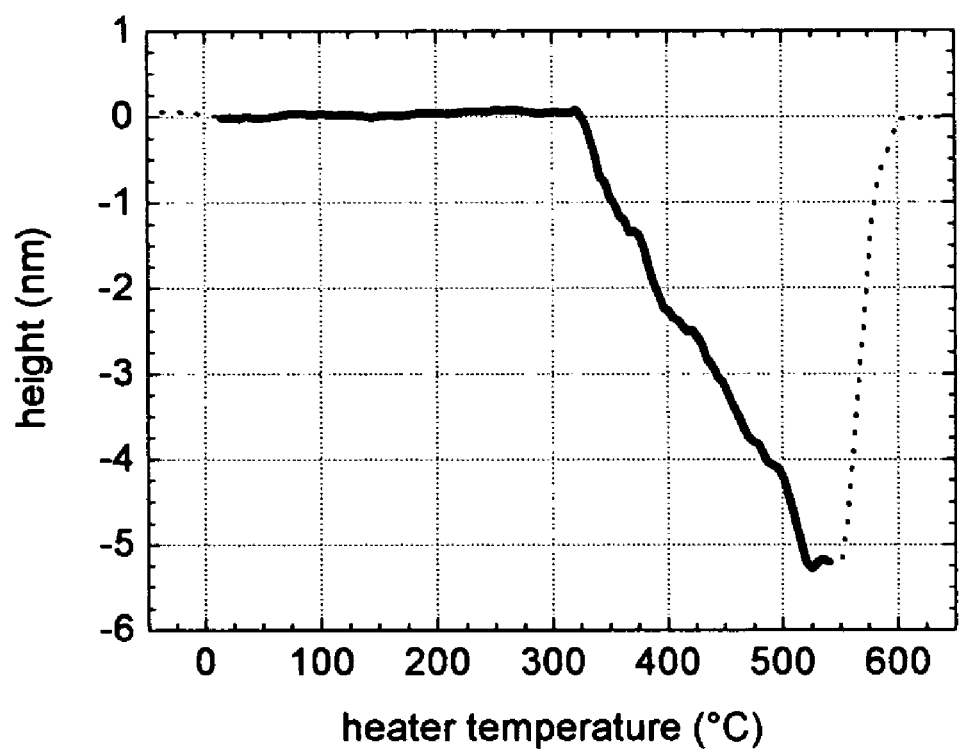
FIG. 6 is graph showing the line-depth versus probe-temperature diagram for the resist medium of the present invention shown in FIG. 5.

FIG. 6 is graph showing the line-depth versus probe-temperature diagram for the resist medium of the present invention shown in FIG. 5. The polymer used is a mixture of compound of Formula IX and of Formula X wherein R7 is 1,4-phenylene, prepared as hereinbefore described using the furan protection method described.

Figure 7:
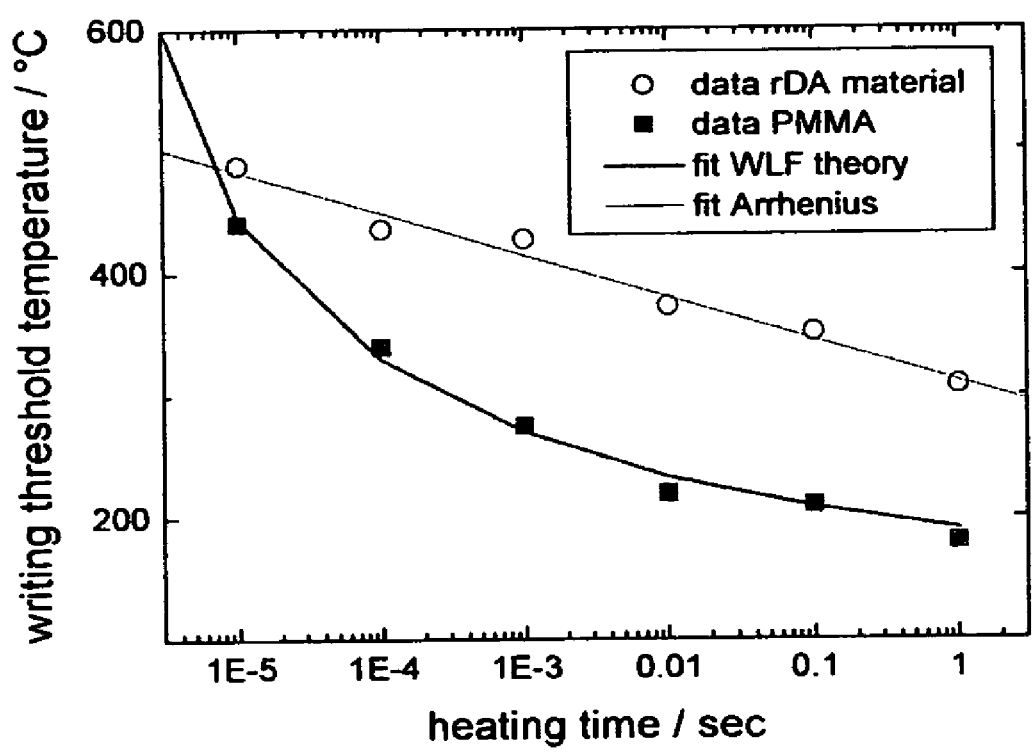
FIG. 7 is a graph showing the "writing" kinetics for a resist of the present invention and a conventional resist.

FIG. 7 is a graph showing the "writing" kinetics of a single pixel for a resist of the present invention (thin solid line/circles) and a conventional resist (thick solid line/filled squares). The conventional resist used is poly methyl methacrylate. The resist of the present invention is as described above in relation to FIG. 5. It can clearly seen that exposure times of 10 microsecond per pixel are readily feasible requiring a heater temperature of approximately 500° C. Even shorter exposure times below 1 microsecond or even 100 nanoseconds are readily feasible for a resist of the present invention as the required write temperatures would only be a few tens of degrees higher. For conventional polymer resists, however, prohibitively high writing temperatures in excess of 700° C. would be required in order to achieve the required exposure for writing times below 1 microsecond.

The following examples illustrate the preparation and use of organic polymers and their precursors for use in the recording surfaces of the present invention:

General Methods: Commercial reagents were obtained from Aldrich and used without further purification. Analytical TLC was performed on commercial Merck plates coated with silica gel GF254 (0.24 mm thick). Silica gel for flash chromatography was Merck Kieselgel 60 (230-400 mesh, ASTM). Nuclear magnetic resonance was performed on a Bruker AVANCE 400 FT-NMR spectrometer using deuterated solvents and the solvent peak as a reference. Gel permeation chromatography was performed in tetrahydrofuran (THF) on a Waters chromatograph equipped with four 5-mm Waters columns (300×7.7 mm) connected in series with increasing pore size (100, 1000, 100,000, 1,000,000 Å). A Waters 410 differential refractometer and a 996 photodiode array detector were employed. The polystyrene molecular weights were calculated relative to linear polystyrene standards, whereas the poly(n-butyl acrylate) molecular weights were calculated relative to poly(n-butyl acrylate) standards.

EXAMPLE 1

Cross-link mechanism by hydrogen bonding: Multihydrogen Bonding Polystyrene (MHB-PS). (reference Advanced Materials 2000, 12, 878).

To a solution of PS-VBA 1 (1.5 g, 0.3 mmol) in chloroform (30 mL) was added 2-(6-isocyanatohexylaminocarbonylamino)-6-methyl-4{1H}pyrimidinone (1 g, 3.2 mmol). After addition of catalytic amount of dibutyltin dilaurate, the resulting solution was stirred, refluxed overnight. After cooling down, chloroform (50 mL) was added and the solution was filtered. After concentrating the solution back to 30 mL, 1 g of silica and 1 drop of dibutyltin dilaurate were added, and the mixture was refluxed for additional 1 h. The silica was removed by filtration and the chloroform was partially removed. The viscous mixture was precipitated in methanol. The white powder was then collected and dried to give the desired copolymer (1.19 g). 1H NMR (400 MHz, CDCl3) 13.04 (br s, 1H, intramol H bond), 11.8 (s, 1H, CH2NHCONH), 10.07 (s, 1H, CH2NHCONH), 7.44-6.35 (m, 57H), 5.74 (s, 1H, CH=CCH3 ), 4.94 (s, 2.3H, CH2OCONH), 4.50 (s, 4.1 H, CH2OH), 3.18-3.10 (m, 4H, CH2NCO and CH2NHCONH), 2.20-0.42 (m, 53.5H); IR (neat) 3419, 336, 3220, 3058, 3025, 2925, 2854, 1700, 1662, 1585, 1521, 1493,1452, 1251, 1029, 817, 761, 700 cm-1; Mn=5919, PDI is 1.05. Tg=122.8° C.

EXAMPLE 2

2-Methyl-acrylic acid 2-[3-(6-methyl-4-oxo-1,4-dihydro-pyrimidin-2-yl)-ureido]-ethyl ester. ( (reference Journal of the American Chemical Society 1998, 120, 6761)

A suspension of 6-methylisocytosine (0.98 g, 7.8 mmol), and 2-isocyanatoethyl methacrylate (2.20 g, 14.1 mmol) in dry pyridine (35 mL) was heated under reflux for 2 h, giving a clear solution. Cooling induced the formation of crystals. Acetone was added (20 mL), and the resulting microcrystalline powder was filtered. Recrystallization from ethanol/CHCl3 (1:1, v/v) gave analytically pure product (1.62 g, yield is 74%) 1H NMR (400 MHz, CDCl3) 13.00 (s, 1H, intramol H-bonding), 11.97 (s, 1H, CH2—NH—CO), 10.53 (s, 1H, CH2—NH—CO—NH), 6.20 (s, 1H, CHH=C), 5.80 (s, CCH3CH—CO), 5.56 (s, 1H, CHH=C), 4.31-4.28 (t, j=5.6, 2H, OCH2CH2N), 3.62-3.58 (q, J=5.6 Hz, 2H, OCH2CH2N), 2.26 (s, 3H, CH3-C-NH), 1.96 (s, 3H, CH3—C=CH2), IR (neat) 3250-2800, 1726, 1699, 1664, 1641, 1583, 1521, 1253, 1172, 939 cm-1; Melting point Tm=206.7° C.

EXAMPLE 3

Synthesis of Tris(furfuryloxy)cyclohexylsilane

To a 1000 ml flask was added 100 ml dry of toluene, furfuryl alcohol (70.00 g, 718 mmol) and trethylamine (75.35 g, 746 mmol) was added dropwise a solution of cyclohexyltrichlorosilane (49.2 g, 226 mmol) in dry toluene (150 ml). The reaction mixture was then stirred overnight at room temperature and the heavy suspension was then stirred with diethyl ether (500 ml) and filtered. The precipitate was then triturated with diethyl ether (500 ml) and the combined organic layers dried and evaporated to dryness. The crude product was purified by distillation (169-173 C at 500 mTorr) to afford the tris(furan) as a light yellow oil (83.9 g, 92%). 1H-NMR (400 MHz, CDCl3) d: 7.40 (m, 3H, ArH), 6.33 (m, 3H, ArH), 6.24 (m, 3H, ArH), 4.72 (s, 6H, OCH2), 1.82-1.88 (m, 4H, CH2), 1.65-1.70 (m, 6H, CH2), and 0.85 (t, 1H, CH); 13C-NMR (100 MHz, CDCl3) d: 153.5, 142.4, 110.0, 107.8, 57.4, 27.6, 26.6, 26.4, 22.9.

EXAMPLE 4

Bis Furan protected derivative of 1,1 (Methylenedi-4,1-phenylene)bismaleimide

The bismaleimide (45.45 g, 127 mmol) was dissolved in tetrahydrofuran (100 ml) and furan (51.80 g, 762 mmol) was added dropwise. The reaction mixture was then heated at reflux under nitrogen for 6 hours and then left to stir at room temperature overnight followed by evaporation to dryness. The crude product was purified by filtration through silica to give the bis(furan) protected derivative as a white solid (55.0 g, 88%); 1H-NMR (400 MHz, CDCl3) d: 7.12 and 7.26

(ABq, 8H, J=7.4 Hz, ArH), 6.49 (s, 4H, Alkene-CH), 5.50 (s, 4H, CH—O), 3.96 (s, 2H, CH2), and 2.94 (s, 4H, CH).

EXAMPLE 5

Bis 2-Methylfuran protected derivative of 7,7-dihexyl-1,14-(bismaleimide)tetradecane.

The bismaleimide (Loctite) (5.00 g, 7.9 mmol) was dissolved in tetrahydrofuran (30 ml) and 2-methylfuran (1.30 g, 15.8 mmol) was added dropwise. The reaction mixture was then heated at reflux under nitrogen for 18 hours and evaporated to dryness. The crude product was purified by filtration through silica to give the bis(2-methylfuran) protected derivative as a clear oil (4.50 g, 70%); 1H-NMR (400 MHz, CDCl3) d: 6.58 (d, 2H, J=1.4 Hz, Alkene CH), 6.58 (d, 2H, J=1.1 Hz, Alkene CH), 5.05 (s, 2H, CH —O), 3.43 (t, 4H, N—CH2), 2.82 and 3.01 (each d, 2H, CH), 1.72 (s, 6H, furan-CH3), 1.30-1.65 (m, 36H, CH2), and 0.90 (t, 6H, CH3).

EXAMPLE 6

Formulation of Prepolymer (B-staging via in-situ protection)

1,1-(Methylenedi-4,1-phenylene)bismaleimide (6.65 g, 18.6 mmol) was dissolved in NMP (20 ml); tris(furfuryloxy)cyclohexylsilane of Example 3 (5.00 g, 12.4 mmol) and furan (1.68 g, 24.8 mmol) were then added and the reaction mixture stirred at room temperature for 48 hours. Excess furan (8.41 g, 124 mmol) was then added followed by stirring at room temperature for 24 hours to protect all of the remaining maleimide groups. The reaction mixture was then precipitated (2×) into hexane (500 ml) to give the B-staged Diels Alder polymer (11.5 g, 86%). The molecular weight, viscosity and spinning characteristics of the B-staged polymer could be controlled by the ratio of bis(maleimide):tris(furan):furan in the original reaction mixture. 1H-NMR (400 MHz, CDCl3) d: 7.54-6.30 (m, ArH and alkene CH), 4.60-3.00 (br m, CH2 and CH), and 1.05-2.20 (m, CH2).

EXAMPLE 7

Formulation of Prepolymer (B-staging via protected monomers).

A mixture of the bis(furan) protected bismaleiimide of Example 4 (9.34 g, 18.6 mmol) and the tris(furfuryloxy)cyclohexylsilane of Example 3 (5.00 g, 12.4 mmol) were dissolved in NMP (20 ml) and heated at 80 C for 12 hours. An excess of furan (8.41 g, 124 mmol) was then added followed by stirring at room temperature for 24 hours to protect all of the remaining deprotected maleimide groups. The reaction mixture was then precipitated (2×) into hexane (500 ml) to give the B-staged Diels Alder polymer, 5, (12.1 g, 90.5%). The molecular weight, viscosity and spinning characteristics of the B-staged polymer prepared by this alternate method could be controlled by the ratio of bis(maleimide):tris(furan):furan in the original reaction mixture, the reaction temperature and reaction time. 1H-NMR (400 MHz, CDCl3) d: 7.54-6.30 (m, ArH and alkene CH), 4.60-3.00 (br m, CH2 and CH), and 1.05-2.20 (m, CH2).

EXAMPLE 8

Fabrication of Thin Crosslinked Films.

The B-staged polymer (1.0 g) was dissolved in dry NMP (9.0 g) (10.0 wt % solution) and this solution was then filtered through a 0.1 mm filter and spun coated onto silicon wafers at 2500 rpm. The wafers were then heated at 120 C for 5 hours to cause full deprotection of the maleiimide groups with associated loss of the furan protecting group and crosslinking. The resulting thin films, the thickness of which could be controlled by spin speed and initial wt %, were shown to be fully crosslinked and defect free, suitable for use as a resist polymer in the lithographic process of the present invention.

While the invention has been described with respect to certain preferred embodiments and exemplifications, it is not intended to limit the scope of the invention thereby, but solely by the claims appended hereto.

APPENDIX 1

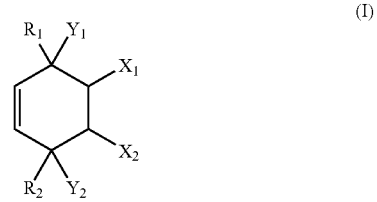

(I)

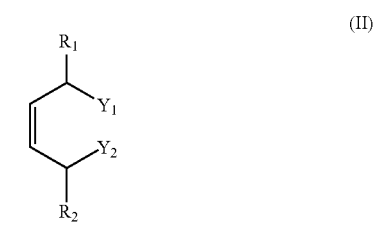

(II)

(III)

(IV)

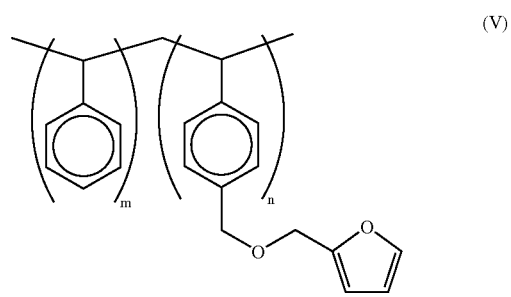

(V)

APPENDIX 2

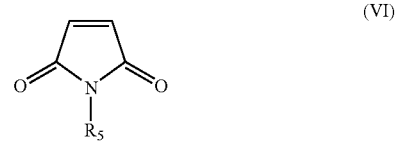

(VI)

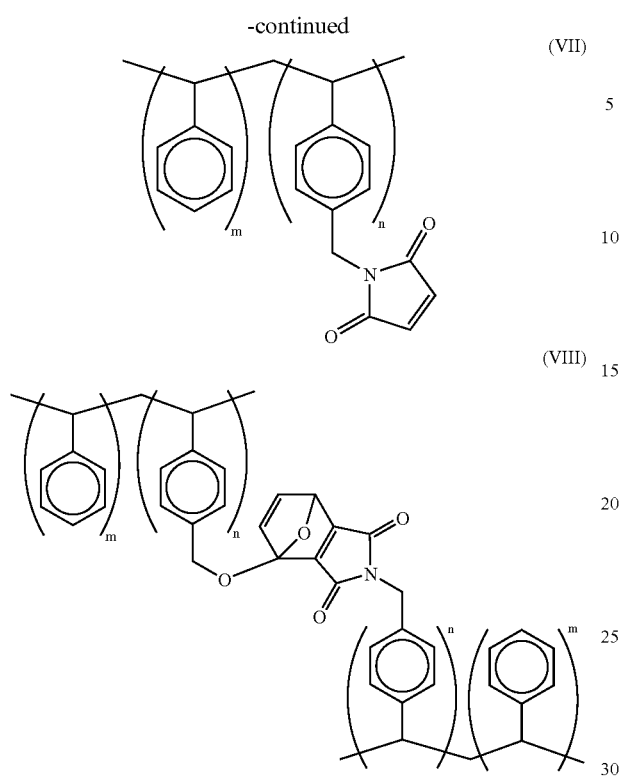
(VII)
(VIII)
APPENDIX 3
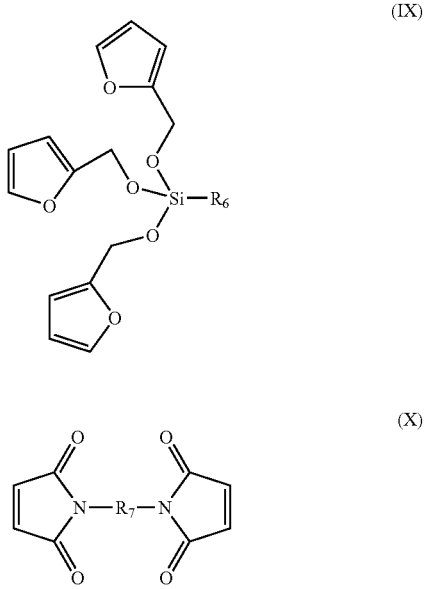
(IX)
(X)
APPENDIX 4
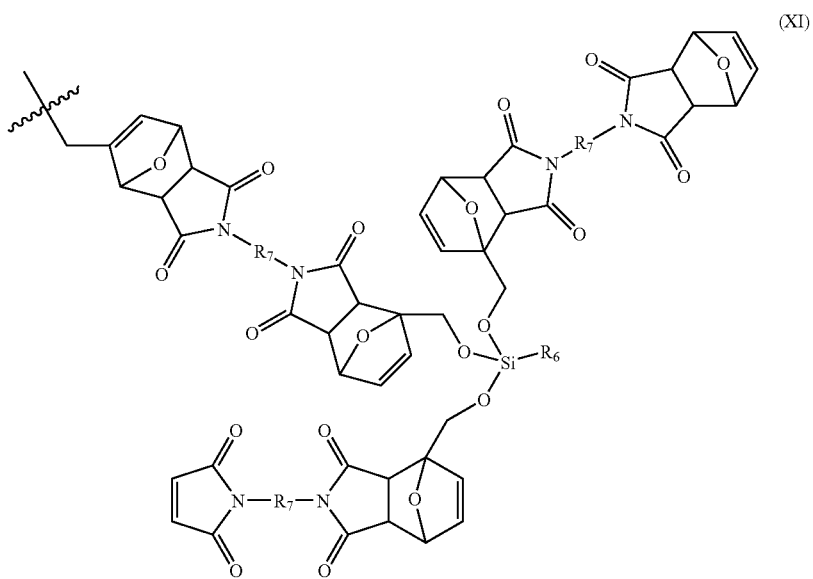
(XI)

APPENDIX 5
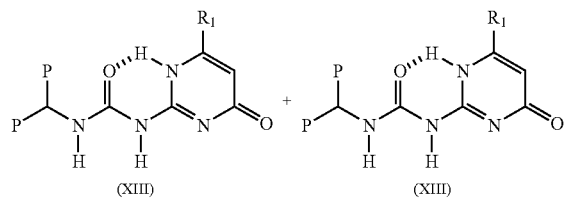
(XIII)     (XIII)
(XII)
APPENDIX 6
Example 1
Synthesis of Tris(furfuryloxy)cyclohexylsilane
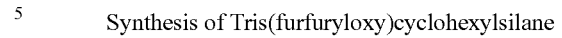
Example 2
Bis Furan protected derivative of 1,1(Methylenedi-4,1-phenylene)bismaleimide
APPENDIX 7
Example 3
Bis 2-Methylfuran protected derivative of 7,7-dihexyl-1,14-(bismaleimide)tetradecane
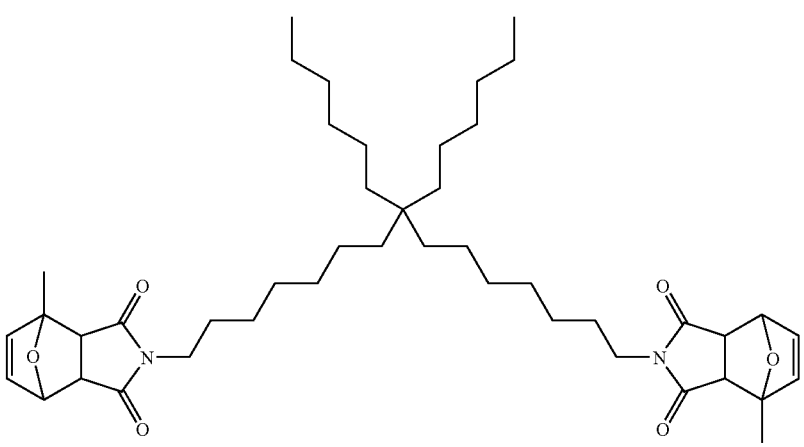

APPENDIX 8
Formulation of Prepolymer (B-staging via in-situ protection)  5
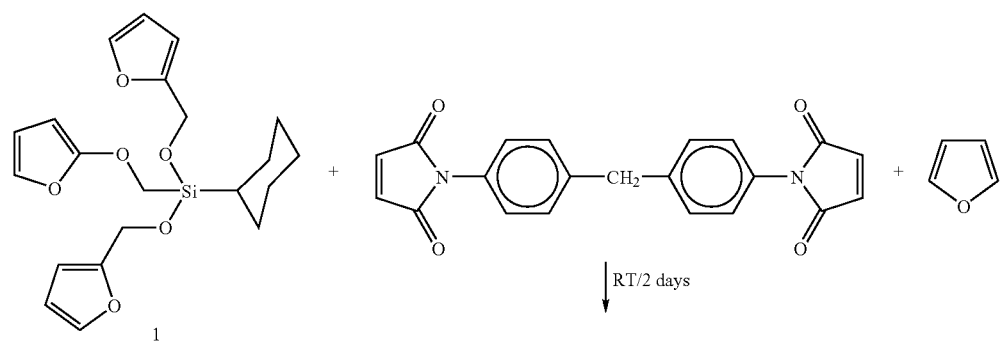
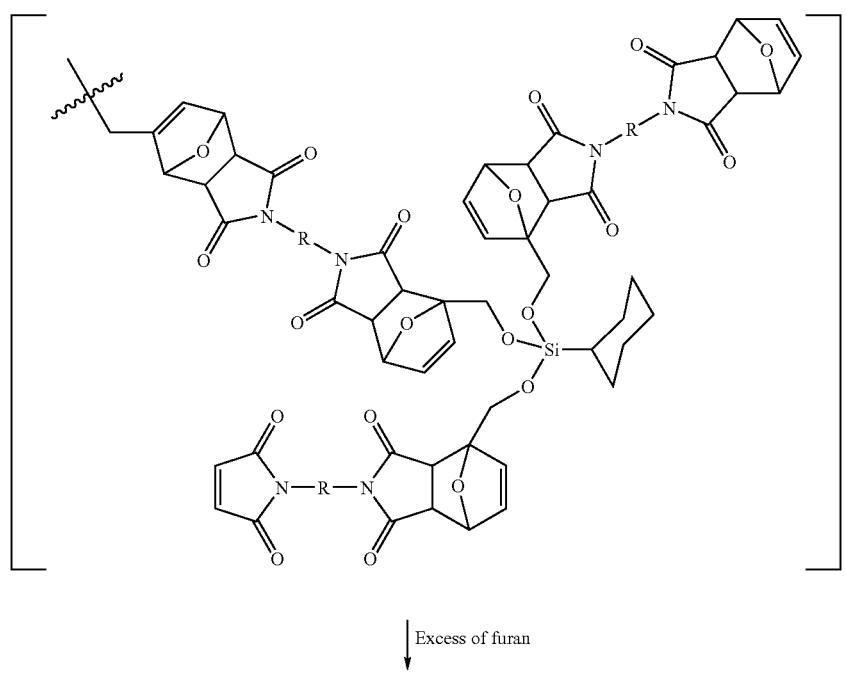

-continued
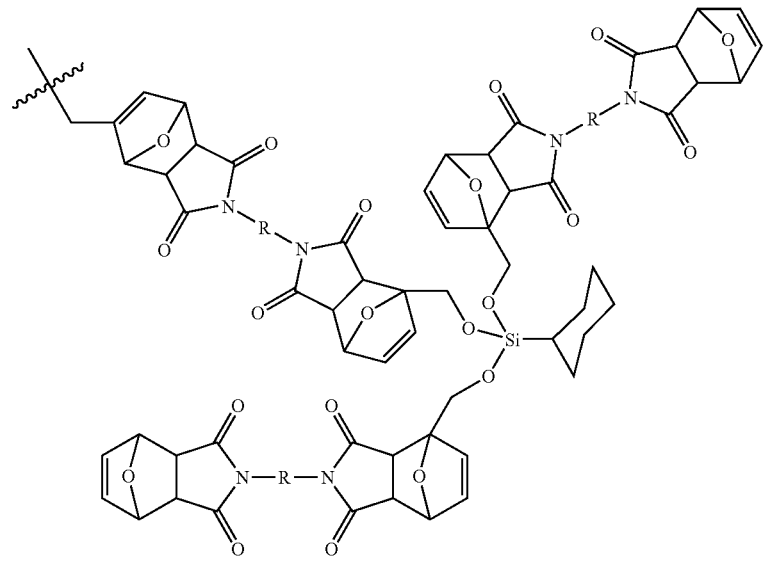
4
APPENDIX 9
Formulation of Prepolymer (B-staging via protected polymers)
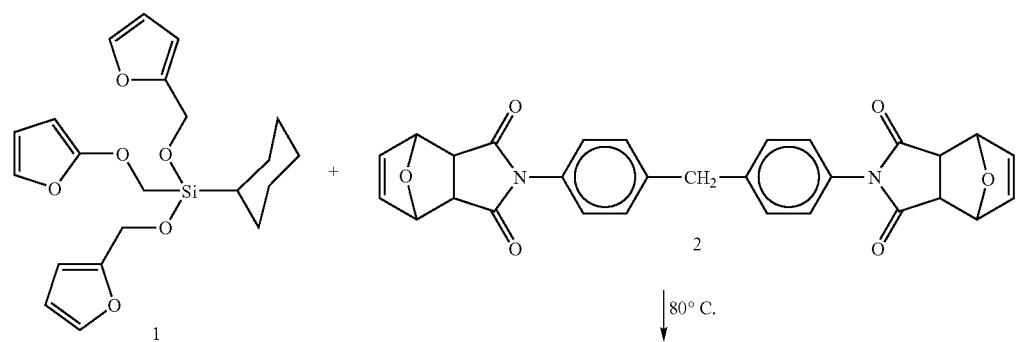

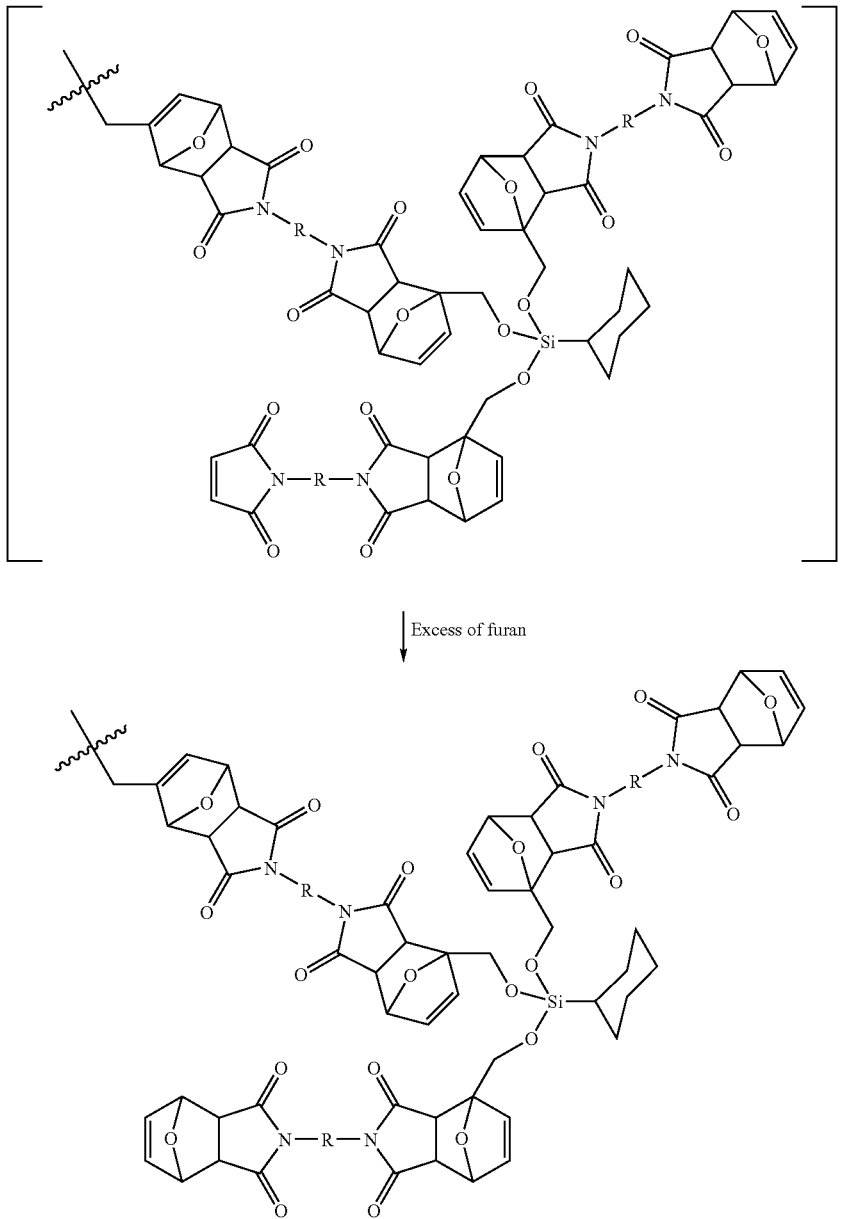

The invention claimed is:

1. A method, comprising:
providing a substrate over which is located a layer of polymer resist, wherein the polymer resist contains thermally reversible crosslinkages, wherein the Diels-Alder adduct is the product of a dienophile and a substituted furan;
removing a portion of the resist layer to reveal an alignment marker;
aligning an AFM probe with the alignment marker; and
scanning the surface of the polymer resist layer with the AFM probe positioned in contact with the resist layer, wherein heating the probe and a squashing-type mechanical action of the probe produces features in the layer by thermally reversing the crosslinkages.

* * * * *